United States Patent [19]

Morrison, Jr.

[11] 4,391,697
[45] Jul. 5, 1983

[54] HIGH RATE MAGNETRON SPUTTERING OF HIGH PERMEABILITY MATERIALS

[75] Inventor: Charles F. Morrison, Jr., Boulder, Colo.

[73] Assignee: Vac-Tec Systems, Inc., Boulder, Colo.

[21] Appl. No.: 408,233

[22] Filed: Aug. 16, 1982

[51] Int. Cl.³ .............................................. C23C 15/00
[52] U.S. Cl. .................................................. 204/298
[58] Field of Search ........................................ 204/298

[56] References Cited

U.S. PATENT DOCUMENTS

| | | | |
|---|---|---|---|
| 4,162,954 | 7/1979 | Morrison | 204/298 |
| 4,239,611 | 12/1980 | Morrison | 204/298 |
| 4,265,729 | 5/1981 | Morrison | 204/298 |
| 4,282,083 | 8/1981 | Kertesz et al. | 204/298 |
| 4,309,266 | 1/1982 | Nakamura et al. | 204/298 |
| 4,361,472 | 11/1982 | Morrison | 204/298 |

*Primary Examiner*—Arthur P. Demers
*Attorney, Agent, or Firm*—Gerald J. Ferguson, Jr.; Joseph J. Baker; C. Lamont Whitham

[57] ABSTRACT

Apparatus for sputtering a target including at least first and second elements spaced from one another by a gap; a plasma generator disposed in the gap; and a trapping magnetic field which confines at least some of the plasma adjacent the target where the target may comprise a magnetically permeable material. First and second magnets may generate the trapping magnetic field and a further field which includes a gap field across the gap where the gap field is utilized by the plasma generating means. If the target comprises a magnetically permeable material, the trapping field will pass through and over the target while the further field will pass sequentially through said first target element, the gap, and then the second target element.

19 Claims, 7 Drawing Figures

HIGH RATE MAGNETRON SPUTTERING OF HIGH PERMEABILITY MATERIALS

BACKGROUND OF THE INVENTION

The present invention relates generally to the art of forming thin films, and more particularly to improvements in the magnetron sputtering process and apparatus for forming such films which may be highly permeable materials.

One technique for depositing thin films of a desired material on a substrate is diode sputtering. A target comprising the material to be deposited, is bombarded by gas ions which have been accelerated by an intense electric field. The bombardment ejects atomic sized particles of the target which settle upon the substrate surface as a thin film. This sputtering process is slow compared to other techniques and the electric voltage required to produce a diode sputtered film is relatively high. The current saturates at a low value.

Disadvantages associated with the diode sputtering process have been alleviated to a large degree by the use of magnetron sputtering. As can be seen in FIG. 1A, an array of magnets 10 and 12 is positioned behind a low permeability target material 14 where the magnetron may produce a discharge of "racetrack" shape and where the magnets may be of the type disclosed in U.S. Pats. 4,162,954, 4,180,450 and 4,265,729, issued to Charles F. Morrison, Jr., which patents are incorporated herein by reference. Coupling plate 16 serves to short the magnetic fields between the two magnets at the lower portion thereof. Because of the low permeability of the target material, the magnetic lines of force 18 extend from the magnets and pass through the target material 14 and travel substantially parallel to the plane of the target surface for a certain distance. An electric field is established perpendicular to at least a portion of the magnetic field. Gas ions are accelerated by the electric field and strike target 14 causing it to eject atomic sized particles as in diode sputtering. However, the magnetic field above the target surface confines secondary electrons ejected from the target to the vicinity of the target surface and thus accelerates the rate of collisions between the secondary electrons and gas molecules of the gas plasma (generally argon). These additional collisions serve to generate additional gas ions and, hence, more gas plasma which is confined to the vicinity of the target surface. Thus, the deposition rate of magnetron sputtering over that of diode sputtering is increased by an order of magnitude.

It can be seen that the looping magnetic field as indicated by lines of force 18 is necessary to trap the plasma near the surface of target 14. However, if it is desirable to sputter a high permeability material with magnetron sputtering, the looping magnetic field will be short circuited as shown in FIG. 1B. Effectively the high permeability target 24 couples all of the magnetic lines of force from one magnet to the other just as does the coupling plate 16. The lack of the looping magnetic field 18 to trap the plasma in the vicinity of the high permeability target material would reduce the magnetron sputtering to that of ordinary diode sputtering with its attendant relatively slow sputter rate due to current saturation.

A number of solutions have been attempted to obtain magnetron sputtering of highly permeable materials with only limited success. In one embodiment, a very thin high permeability target is utilized so as to become saturated by the magnets and thus incapable of shunting all of the magnetic field. Unfortunately, if the targets are made thin enough such that the magnets do not shunt virtually all of the field, the targets are rapidly depleted before a film is accumulated on substantial quantities of receiving substrate. Other approaches are to utilize relatively normal target thicknesses but in conjunction with high strength magnets again serving to saturate the target material and maintain a weak magnetic field looping thereover. This generally requires at least a second set of magnets or an extremely powerful electromagnet. This works reasonably well with moderate sized targets of iron and nickel but is generally inadequate for Permalloy, Samarium cobalt, and other very high permeability materials. This approach is generally described in my co-pending patent application Ser. No. 28,434, filed Apr. 9, 1979.

One further method of permitting magnetron sputtering is to reduce the strength of field required to saturate the target material. This can be accomplished by heating the target material to above its Curie point and this is discussed in U.S. Pat. No. 4,299,678 issued to Meckel on Nov. 10, 1981. However, none of the above methods lend themselves to serious industrial coating and thus most sputtering of highly permeable materials is still done by diode sputtering with its very slow rates of accumulation.

SUMMARY OF THE INVENTION

In view of the above difficulties with sputtering of high permeability materials, it is an object of the present invention to provide a method and apparatus for high rate sputtering of highly permeable materials as well as nonpermeable materials.

It is a further object of the present invention to provide a method and apparatus for high rate sputtering of permeable materials which does not require magnetic saturation of the target material either by intensive magnetic fields or by heating of the target material to above its Curie point temperature.

The above and other objects are achieved in accordance with the present invention by providing a two piece target with a gap between the pieces where a plasma source is disposed in the gap and a weak trapping field is provided over the target to retain the plasma in the vicinity of the target. If the target comprises a high permeability material, a magnetic field is applied through the target and the gap to establish a plasma source. Because of the gap, not all of the applied field passes through the target and gap—that is, the remainder of the field, becomes the weak trapping field disposed over the target. In this manner, it is possible to sputter materials having very high permeabilities.

BRIEF DESCRIPTION OF THE DRAWINGS

A more complete appreciation of the invention, and many of the attendant advantages thereof, will be readily apparent by reference to the accompanying drawings, wherein.

DETAILED DESCRIPTION OF PREFERRED EMBODIMENTS

Figure 1A:
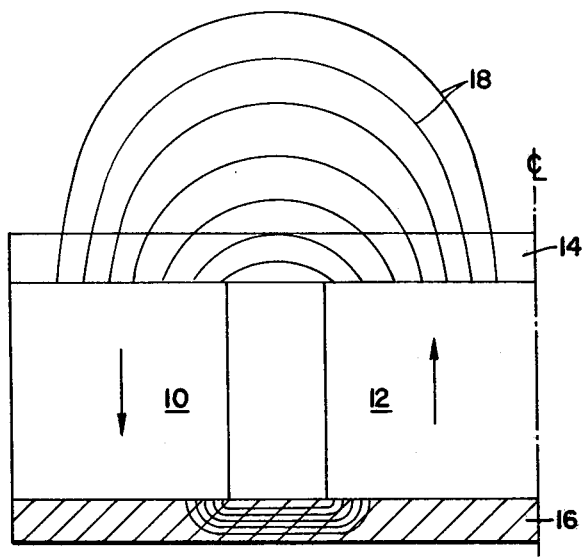
FIG. 1A is a side cross-sectional view of a typical prior art magnetron sputtering system.
Figure 1B:
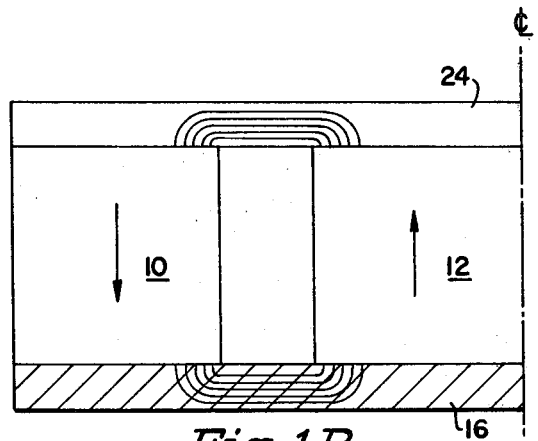
FIG. 1B is a cross-sectional view of a portion of the magnetron sputtering system in FIG. 1A with a high permeability target material.

Referring now more particularly to the drawings wherein like reference numerals designate like elements throughout the several views, it is understood the illustrated embodiments are all interconnected in the requisite pressure gas atmosphere which is conducive to plasma generation from the gas molecules present. The selection of a suitable gas, gas pressure, power supply voltage, cathode to anode spacing and location with respect to the substrate which is to be covered will be clear to those of ordinary skill in the art having reviewed the present disclosure.

Figure 2:
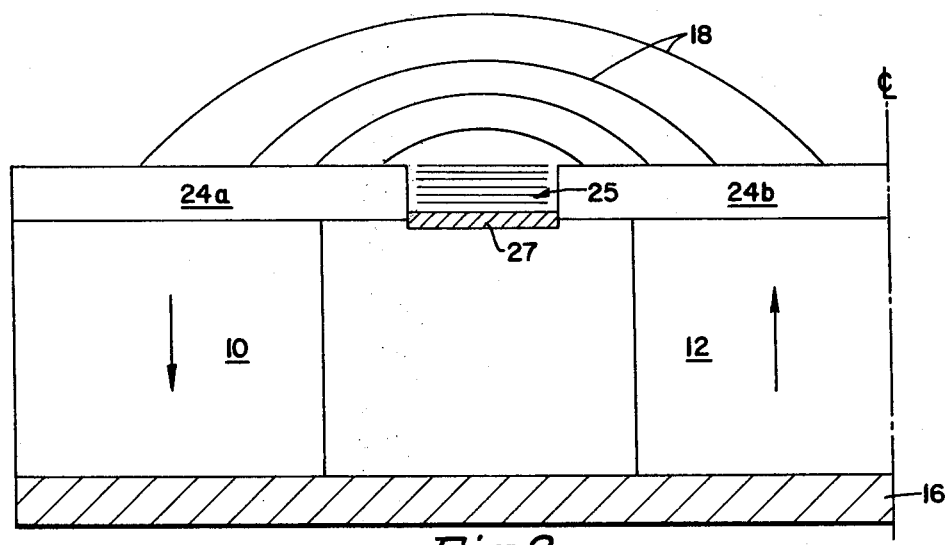
FIG. 2 is a cross-sectional view of a portion of the magnetron sputtering device in FIG. 1A but in accordance with the present invention.

FIG. 2 is a diagrammatic illustration of a cathode in accordance with the invention where the cathode may be of the well known "racetrack" type. The cathode includes first or outer cathode 24a and second or inner cathode 24b separated from one another by a gap 25. A field is illustrated in the gap which is parallel and of equal strength from side to side. Even though the field is between highly permeable blocks of material, it is no stronger than the usual magnetron field. That is, the field is only as strong as the driving magnets 10 and 12 underneath. In addition to generating the strong field in the gap 25, the magnets 10 and 12 also generate a weak looping field 18 over the target 24a, 24b.

As the distance above the gap 25 increases, the field strength drops rapidly below the required field strength of 80-100 gauss required for magnetron action in the FIG. 1A embodiment. Thus, it is clear the gap 25 is the primary plasma generator and the weak looping field overhead serves to contain the plasma adjacent the target elements where most target materials sputter at various power densities at from 1-25 microns of argon. Thus, the plasma generation function and the plasma use function are separated in the present invention. This is in contradistinction to the FIG. 1A arrangement where the field 18 is used both for plasma generation (to confine the ionizing electrons) and for plasma use (to confine the plasma which sputters the target). If the gap generates plasma too readily, the target might not develop sufficient acceleration sheath to cause sputtering. If plasma production is too sparce, saturation occurs or too high voltages are required. Gap geometry and operating pressure combine to give control over these relationships. The following rates have been measured and normalized to 67 watts/square inch at four inch target to substrate distance:

| | |
|---|---|
| Fe | |
| Ni | 4500 A/minute |
| Co | |
| Permallog (79% Ni, 4% Mo, 16+% Fe) | 3500 A/minute |

A floor for the gap is also provided with a floor 27 which may comprise either a thin permeable material such as the target material or a non-permeable material such as ceramic. It has been observed that the gap floor can sputter. Thus, if the floor is target material, the output of the cathode will not be contaminated. This adds to the complexity and must be done carefully to provide long lifetime without magnetically shorting the inner and outer targets together. However, as the width of the gap is reduced to achieve a practical minimum, the gap floor becomes less critical. At ⅛ inch wide, a ceramic floor made almost no change in the operating characteristics. The ceramic was quickly coated to build some minor thickness with time. If the buildup becomes a problem such that the field in the gap would be shunted, the gap can be slightly widened, such that the net rate of buildup is very slow. It may be that extremely small gaps might not have a sufficient looping magnetic field to cause magnetron action as in one embodiment, a 1/16" wide gap would not operate.

Figure 3:
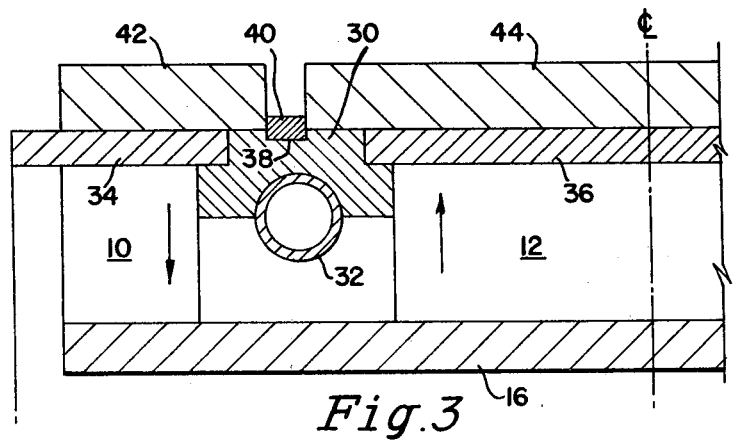
FIG. 3 is a side cross-sectional view illustrating how a commercially available magnetron sputtering system can be modified to operate in accordance with the present invention.

FIG. 3 illustrates a further embodiment of the present invention which can be retrofitted to an existing magnetron system manufactured and sold by Vac-Tec Systems, Inc., 2590 Central Avenue, Boulder, Colorado 80301. In FIG. 3, the highly permeable coupling plate 16 has a center magnet 12 mounted thereon. The outer magnet 10 is also mounted on the base coupling plate 16. A non-permeable high thermal conductivity coupler 30 is provided with a conventional water cooling tube 32 mounted thereon. The thermal conductivity coupler is brazed to highly permeable coupling plates 34 and 36 along their lines of contact. It can be seen that the magnetron is symmetrical across center line $C_L$ (as is the case in the other figures of the drawing) and that the pole piece 36 when viewed from above will be a flat circular, oblong or rectangular plate and that pole piece 34 will be a relatively flat circular, oblong or rectangular annulus. A groove 38 in high thermal conductivity coupler 30 is provided to accommodate ceramic floor and target separator 40. Finally, the two highly permeable target elements 42 and 44 are located on the coupling plates 34 and 36 and spaced apart by ceramic insert 40.

For most targets, except possibly nickel, the mangetic field can provide the target element hold down function such that no clamp is required. It is desirable that the bottom of the target pieces be ground flat for good heat and magnetic field transfer. The ceramic insert, in addition to preventing the outer target element 42 from being pulled into center target element 44, also makes it impossible to contaminate the cathode output by sputtering the thermal conductivity coupler 30. Loading and removing target elements requires some care. Because of the strength of magnet 12, center target element 44 is strongly bonded to coupling plate 36. It can only be removed after outer target element 42 and the ceramic separator have been removed. It may be most useful to make the outer target in a number of pieces such that when fully eroded on one side the pieces may be rotated and forend and used again.

Figure 4:
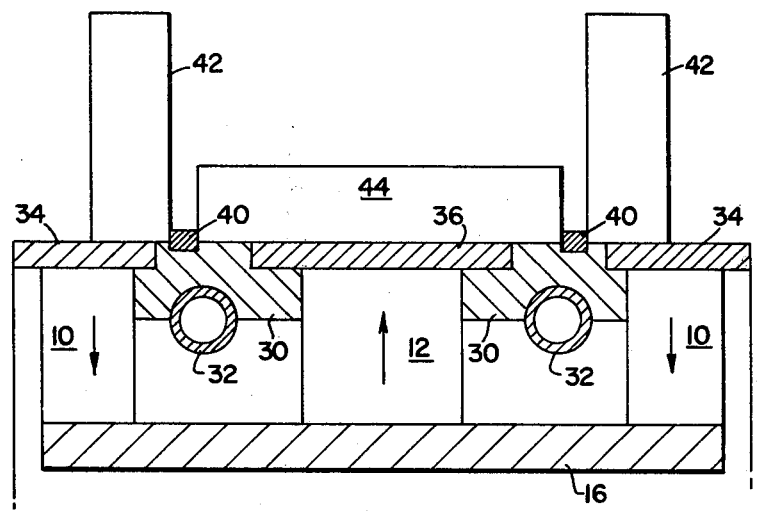
FIG. 4 is a side cross-sectional view of a further embodiment of the present invention.

FIG. 4 illustrates the same high rate sputtering apparatus as shown in FIG. 3 but in full cross-sectional view with a slightly different target element arrangement. The outer target elements 42 extend higher away from the coupling plates than does the center target element 44 and as a consequence are sputtered more heavily than in the FIG. 3 orientation. The distribution of sputtered material from the FIG. 4 cathode arrangement is more uniform over a wider substrate area than with the FIG. 3 embodiment. This appears to be due to the angularly directed material ejected from the upright sputtering surfaces of the outer target elements 42.

Figure 5:
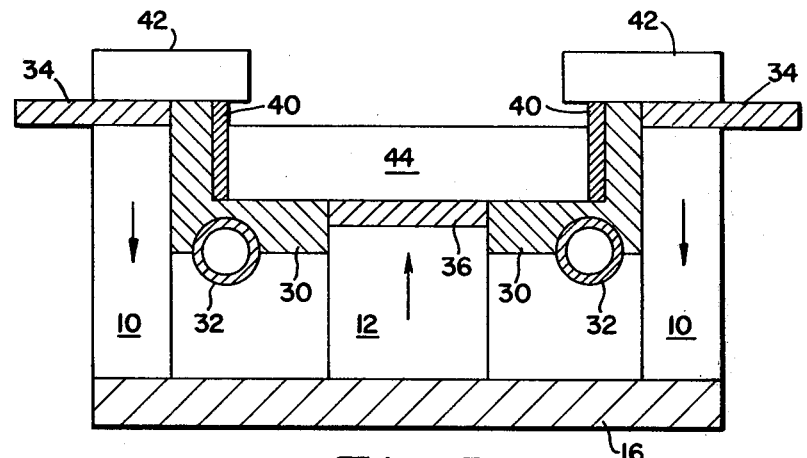
FIG. 5 is a side cross-sectional view of a further embodiment of the present invention.

FIG. 5 shows a further embodiment of the present invention in which the plasma generation is "hidden" from the substrate. The functional arrangement is similar to that in FIG. 3 with the exception that the ceramic insert 40 extends above the surface of the center target element 44 and spaces outer target element 42 therefrom. Thus, the plasma generating intense magnetic field would be in the area between the upper outer edge of center target element 44 and the lower inner edge of outer target element 42 with the weak plasma containment field looping between target elements 42 and 44. In this configuration, the ceramic back 40 on the generator gap is much less critical, for that area is very quickly coated by the low angle sputtering from the center target. This embodiment is more critical to thickness of the center target for the gap should be at least $\frac{1}{8}$ inch.

It is also possible in the FIG. 5 embodiment to feed target material from the edge—that is, for example, portions 42 shown in FIG. 5 could be separate elements where the right portion 42 would be fed to the left while the left portion 42 would be fed to the right.

Figure 6:
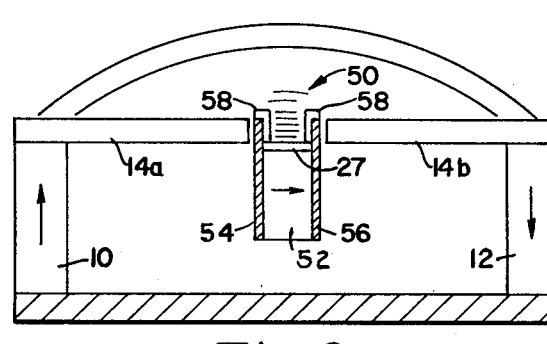
FIG. 6 is a side cross-sectional view illustrating the use of the present invention for plasma generation in a further sputtering arrangement.

Although the greatest advantage of the present invention is the ability to high rate sputter highly permeable materials, it can also be used to high rate sputter non-permeable target materials and still maintain the advantageous highly efficient plasma generation which characterizes the present invention. FIG. 6 illustrates an embodiment in which high rate sputtering of a non-permeable target can be achieved while maintaining the desirable plasma generator although this embodiment could also be used to sputter permeable materials. Conventional center and outer magnets 12 and 10, respectively, are located on coupling plate 16. The low permeability of non-permeable target material 14a,14b is located on the magnets 10 and 12 with an annular gap 50 separating inner and outer target materials elements. Disposed beneath the gap is a magnet 52 for generating a strong magnetic field in the gap. Magnets 10 and 12 generate the desired weak field over the target 14a, 14b. Permeable pole pieces 54 and 56 extend into the gap 50 to provide a strong field therein. It is this strong field which is responsible for the high rate of plasma generation. The pole pieces are preferably coated with layers 58 comprising the material of targets 14a, 14b. Thus, the strong magnetic field created by pole pieces 54 and 56 in conjunction with magnet 52 will comprise a high rate plasma generator which will feed plasma up into the weak magnetron trapping field and thence down onto the non-permeable target elements 14a, 14b for sputtering thereof.

It should be appreciated both the center and outer target elements and all of the gap surfaces, with the exception of the FIG. 6 embodiment, are at the same electrical potential even though different processes are taking place. The difference between plasma generator and target areas is a matter of geometry and the nature of the magnetic field present. The cathodic plasma generators of FIGS. 2–5 undergo some sputtering of the gap surfaces, but because of the parallel faces much of the sputtered material is deposited on the opposite face. This is quite conservative of generator structure, but can cause slow recovery from oxide or other contamination of the generator. Recovery times of the FIG. 5 embodiment tends to be much shorter than that for the FIG. 3 embodiment.

The weak dome or trapping field and strong plasma generator combination of the present invention overcomes the high permeability barrier to high rate sputtering. The greater the permeability, the better the present invention works because it constructively uses the permeability, rather than fighting it. The invention at least in part separates the plasma generation and sputtering functions, a division that can enable optimization of both.

In general, any part of one pole-face target that can be made to direct lines of force toward the other and over the plasma source can be made to sputter by the trapped plasma. In much magnetron work, there is a concern about not connecting anode and cathode by lines of force because plasma might escape and sputtering might not be possible. As the plasma generation function is separated from the cathode function, this concern can also be eliminated.

The present invention may be seen as an example of the use of a plasma source operating into a relatively weak magnetic trap to keep a high plasma density next to the cathode. Without the magnetic trap (on other than the generator), bias sputtering would occur. The plasma generation can be with either an anodic or a cathodic generator. For example in the FIG. 6 embodiment, the generator will be cathodic if the layers 58 are at cathode (or target) potential while it will be anodic if these layers are at anode potential. The cathodic unit tends to sputter, and the anodic unit needs a good source of electrons. Thus, both have limitations.

In the more general case where the generator is not an integral part of either the cathode or the anode, there will be electrical control over the generator output so that current and voltage can be separately controlled. This could be effected by providing a trapping field over the target with a plasma source removed from the target—that is, one not disposed in a gap in the target as in the present invention. Without this triode (or tetrode) control, it may not always be possible to obtain desired operating situations.

Thus, in view of the above teachings, many modifications and applications of this invention will become obvious to those of ordinary skill in the art. Different types of magnets (permanent, electro, etc.), materials, ionizing gases, field and magnetic orientations could be utilized depending on the particular characteristics of sputtering which are desired. Thus, the present invention is not limited to the embodiments and examples discussed herein and are limited only in accordance with the appended claims.

I claim:

1. Sputtering apparatus comprising
   a target of material to be sputtered, said target including at least first and second elements spaced from one another by a gap;
   an anode;
   means for generating an electric field between the anode and target;
   plasma generating means for generating a plasma within said gap; and
   means for generating a trapping magnetic field to confine at least some of said plasma adjacent the target.

2. A sputtering apparatus as in claim 1 where said target consists essentially of a magnetically permeable material.

3. A sputtering apparatus as in claim 1 where said target consists essentially of a non-magnetically permeable material.

4. A sputtering apparatus as in claim 1 where said plasma generating means includes means for establishing a magnetic gap field across at least a portion of the gap.

5. A sputtering apparatus as in claim 1 including a floor member disposed at that end of the gap which is removed from where the plasma is confined adjacent the target.

6. A sputtering apparatus as in claim 1 where said first target element is annular and the second target element is disposed at least adjacent the open portion of the annular first target element.

7. Sputtering apparatus as in claims 1 or 6 where said first and second target elements are co-planar.

8. Sputtering apparatus as in claims 1 or 6 where said first and second target elements are disposed in different planes.

9. Sputtering apparatus as in claim 6 where said first and second target elements are perpendicularly disposed with respect to one another.

10. Sputtering apparatus as in claim 9 where said second target element is disposed within the open portion of the first element.

11. Sputtering apparatus as in claims 1 or 6 where said first and second target elements are disposed in different, parallel planes.

12. Sputtering apparatus as in claim 11 where the gap between said first and second elements extends between the inner, lower periphery of said first element and the outer, upper periphery of the second element.

13. Sputtering apparatus as in claim 1 including a first and second magnets for generating the trapping magnetic field and a further field which includes a gap field across the gap where the gap field is utilized by the plasma generating means.

14. Sputtering apparatus as in claim 13 where the target comprises a magnetically permeable material where the trapping field passes through and over the target and said further field passes sequentially through said first target element, the gap, and then the second target element.

15. Sputtering apparatus as in claim 14 where said first and second magnets are respectively disposed adjacent the first and second target elements.

16. Sputtering apparatus as in claim 15 where said first and second magnets are disposed on the side of said target opposite the side where the plasma is confined.

17. Sputtering apparatus as in claim 1 where said means for generating a trapping magnetic field includes first and second magnets.

18. Sputtering apparatus as in claim 17 where said target comprises a magnetically permeable material and said first and second magnets also generates a further field which sequentially passes through said first target element, the gap and then the second target element.

19. Sputtering apparatus as in claim 17 including a third magnet which generates a gap field at least across a portion of the gap where the gap field is utilized by the plasma generating means.

* * * * *